United States Patent
Sugita

(10) Patent No.: US 6,252,662 B1
(45) Date of Patent: Jun. 26, 2001

(54) PROJECTION EXPOSURE APPARATUS AND DEVICE MANUFACTURING METHOD USING THE SAME

(75) Inventor: Mitsuro Sugita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/172,166

(22) Filed: Oct. 14, 1998

(30) Foreign Application Priority Data

Oct. 14, 1997 (JP) .................................................... 9-296358

(51) Int. Cl.[7] .................................................. G01B 11/00
(52) U.S. Cl. ............................................. 356/399; 355/52
(58) Field of Search .................................... 356/400, 401, 356/399; 355/52, 53, 54, 55

(56) References Cited

U.S. PATENT DOCUMENTS 5,825,043 * 10/1998 Suwa ...................................... 250/548

* cited by examiner

*Primary Examiner*—Frank G. Font
*Assistant Examiner*—Andrew H. Lee
(74) *Attorney, Agent, or Firm*—Fitzpatrick, Cella, Harper & Scinto

(57) ABSTRACT

A projection exposure apparatus and a device manufacturing method using the same, wherein a glass material or materials constituting a projection optical system are less deteriorated and high optical performance is assured, through appropriate setting of components of the projection optical system or a pulse light source for projection exposure of a mask pattern onto a substrate to be exposed.

9 Claims, 7 Drawing Sheets

$R \geq (L1^2 + L2^2)^{0.5}$

PROJECTION EXPOSURE APPARATUS AND DEVICE MANUFACTURING METHOD USING THE SAME

FIELD OF THE INVENTION AND RELATED ART

This invention relates to a projection exposure apparatus and a device manufacturing method using the same. More particularly, the invention is suitably usable for the manufacture of devices such as semiconductor devices or liquid crystal devices, for example, wherein an illumination region on a mask having a pattern to be transferred is illuminated and, through full-field exposure or scan exposure with respect to the illumination region, the mask pattern is transferred to a photosensitive substrate, whereby a pattern image is printed thereon.

Recent semiconductor device manufacturing exposure apparatuses of the type that use an excimer laser are provided with a high driving frequency and high power excimer laser for improvement of throughput. As compared with conventional Hg lamps, excimer lasers produce discontinuous pulse light. Also, the peak value of its light intensity is high. For these reasons, there is a possibility that a glass material used in a projection optical system absorbs the energy which causes a change in optical performance.

Typical examples of optical performance to be changed by it are the transmission factor or refractive index. From the standpoint of deterioration of optical performance of a projection optical system, a change in refractive index of a glass material cannot be disregarded.

More specifically, the path of light passing through a projection optical system changes, before and after the refractive index change. This causes a large change in optical performance. Such a change in refractive index of a glass material is attributable to a contraction phenomenon (called "compaction") due to two-photon absorption of the glass material. As regards the amount of change in refractive index caused thereby, as is known in the art, it is determined in accordance with equation (1) below.

Here, $\Delta n'$ is the change in relative refractive index (ppb= $10^{-9}$), N is the pulse number ($10^6$), and I is the energy density (mW/cm$^2$) per one pulse. The refractive index change coefficient $\alpha$ of quartz glass material in this case is about 0.01 in terms of a wavelength of 248 nm, and it is about 1.0 with a wavelength of 193 nm. Further, with the wavelength of 193 nm, there is an example wherein saturation (saturation efficient $\gamma$) at a higher level is taken into account, as equation (2), below. It is known that the refractive index change coefficient $\beta$ of the quartz glass material in this example is about 4.4 (saturation coefficient $\beta$ is 0.4–0.8) in terms of a wavelength of 193 nm. Equation (1) corresponds to a case where the saturation coefficient is not considered ($\gamma=1$).

$$\Delta n' = \alpha \times NI^2 \quad (1)$$

$$\Delta n' = \beta \times (NI^2)^{\gamma} \quad (2)$$

It is seen that, in accordance with the above equation, a change in refractive index is large in a portion within the projection optical system where the pulse energy density is high, that is, the portion where the exposure light is collected. Projection optical systems used in semiconductor device manufacturing exposure apparatuses generally comprise a reduction system of 1:5 or 1:4. Thus, light is concentrated at a portion adjacent to the image plane.

In consideration of the above, in projection optical systems of recent exposure apparatuses having an excimer laser, in order to avoid damage of glass materials due to compaction, a lens closest to the image plane (wafer surface) is placed away from the image plane, as much as possible, so that the lens is disposed on a light path where the exposure light is expanded more. In other words, optical design is made under the restrictive condition that the distance between the projection optical system and the object (substrate) to be exposed, i.e., back focus, should be made longer.

The restrictive condition that the back focus of a projection optical system has to be long, in the optical design of an exposure apparatus in which strictest optical performance is required also from the point of wave optics, significantly narrows design latitude, and it may cause deterioration of optical performance.

SUMMARY OF THE INVENTION

It is an object of the present invention to provide a projection exposure apparatus and/or a device manufacturing method using the same, wherein a glass material or materials constituting a projection optical system are less deteriorated and high optical performance is assured, through appropriate setting of components of the projection optical system or a pulse light source for projection exposure of a mask pattern onto a substrate to be exposed.

In accordance with an aspect of the present invention, there is provided a projection exposure apparatus, comprising: an illumination optical system for illuminating a pattern of a mask with pulse light from a light source; and a projection optical system for projecting the pattern of the mask onto a rectangular region on a substrate; wherein said exposure apparatus satisfies a relation $$\tau > (\beta/\Delta n'_{max})^{1/\gamma} N I_0^2 f^2(D)$$

where $\tau$ is the width of a single pulse of the pulse light, D is the distance from the last surface of the projection optical system to the surface of the substrate, $\beta$, $\gamma$ and $\Delta n'$ are the coefficient of refractive index change of, the saturation coefficient of and the tolerable change in relative refractive index of the glass material of the final lens of the projection optical system, respectively, N is the number of pulses irradiated, and $I_0$ is the energy density per pulse upon the image plane; and when $L_1$ and $L_2$ are half lengths of two sides of the rectangular region ($L_1 \leq L_2$), A is the numerical aperture of the projection optical system, and $\sigma$ is the coherence factor determined by an illumination condition, $$f(D) = \begin{cases} 1 & (R < L_1) \\ 1 - (2/\pi)[\phi_1 - \sin(2\phi_1)/2] & (L_1 \leq R < L_2) \\ 1 - (2/\pi)\{\phi_1 + \phi_2 - [\sin(2\phi_1) + \sin(2\phi_2)]/2\} & \left(L_2 \leq R < \sqrt{L_1^2 + L_2^2}\right) \\ 4L_1 L_2 / \pi R^2 & \left(\sqrt{L_1^2 + L_2^2} \leq R\right) \end{cases}$$

wherein $R = \left[A\sigma \big/ \sqrt{1 - (A\sigma)^2}\right] D$, $\cos\phi_1 = L_1/R$ and $\cos\phi_2 = L_2/R$.

In accordance with another aspect of the present invention, there is provided a projection exposure apparatus, comprising: an illumination optical system for illuminating a pattern of a mask with pulse light from a light source; and a projection optical system for projecting the pattern of the mask onto a rectangular region on a substrate; wherein a pulse light emission time ratio of the pulse light is approximately not less than $2\times10^{-5}$, and wherein the distance from the last surface of the projection optical system to the surface of the substrate is approximately not greater than 12 mm.

In this aspect of the present invention, when the light source has an emission frequency of 1 KHz, the pulse width of a single pulse of the pulse light may be approximately not less than 20 ns.

In accordance with a further aspect of the present invention, there is provided a projection exposure apparatus, comprising: an illumination optical system for illuminating a pattern of a mask with pulse light from a light source; and a projection optical system for projecting the pattern of the mask onto a rectangular region on a substrate; wherein a pulse light emission time ratio of the pulse light is approximately not less than $4\times10^{-5}$, and wherein the distance from the last surface of the projection optical system to the surface of the substrate is approximately not greater than 8 mm.

In this aspect of the present invention, when the light source has an emission frequency of 1 KHz, the pulse width of a single pulse of the pulse light may be approximately not less than 40 ns.

In the above-described aspects of the present invention, the pulse light may have a wavelength of about 193 nm.

In the above-described aspects of the present invention, the light source may comprise an excimer laser.

In the above-described aspects of the present invention, the apparatus may further comprise scanning means for relatively and scanningly moving the mask and the substrate, in a timed relation and at a speed ratio corresponding to the projection magnification of the projection optical system, for scanning projection exposure.

In accordance with a yet further aspect of the present invention, there is provided a device manufacturing method comprising the steps of: projecting a pattern of a reticle onto the surface of a wafer through a projection exposure apparatus according to any one of the above-described aspects of the present invention, for exposure of the wafer; and developing the exposed wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
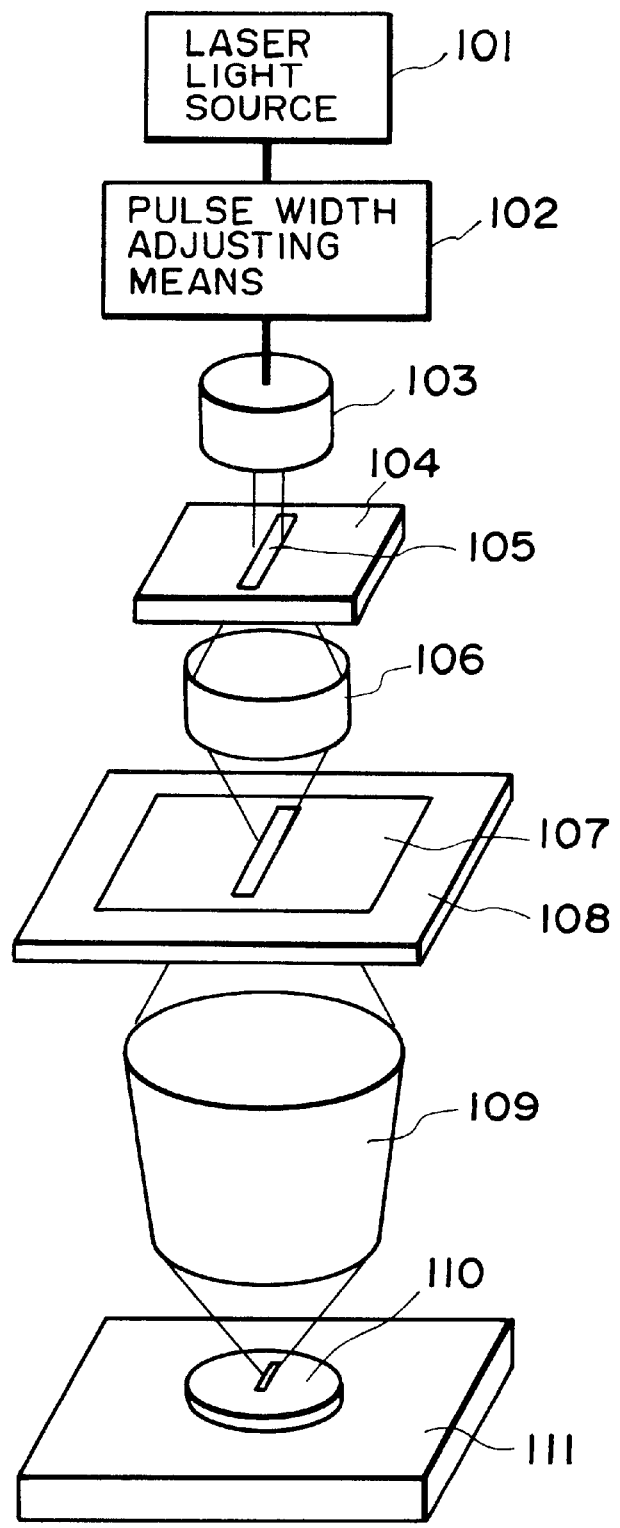
FIG. 1 is a schematic view of a main portion of a projection exposure apparatus according to a first embodiment of the present invention.

Before explaining preferred embodiments of the present invention, a description will be made of the results of an investigation performed in regard to the relationship among damage of a glass material of a projection optical system caused by absorption of exposure light by the glass material, the characteristic of a laser light source, and the structure of the projection optical system.

First, referring to the drawings, the results of investigations and solutions for obtaining good pattern images with a projection optical system will be described.

One of the portions of a projection optical system where light energy is most concentrated is the last lens placed at the final lens surface, that is, the lens closest to a wafer. Further, of such a last lens, the portion around the optical axis, that is, the central portion is the location where the light energy is most concentrated.

According to investigations made by the inventor, it has been found that there is a relation as equation (3) below between the light energy at the central portion of the last lens and the back focus, i.e., the distance from the last lens to the wafer surface.

$$I = f(D)I_0 \quad (3)$$

$$f(D) = \begin{cases} 1 & (R < L_1) \\ 1 - (2/\pi)[\phi_1 - \sin(2\phi_1)/2] & (L_1 \leq R < L_2) \\ 1 - (2/\pi)\{\phi_1 + \phi_2 - [\sin(2\phi_1) + \sin(2\phi_2)]/2\} & (L_2 \leq R < \sqrt{L_1^2 + L_2^2}) \\ 4L_1L_2/\pi R^2 & (\sqrt{L_1^2 + L_2^2} \leq R) \end{cases}$$

wherein $R = \left[A\sigma / \sqrt{1-(A\sigma)^2}\right] D$, $\cos\phi_1 = L_1/R$ and $\cos\phi_2 = L_2/R$ wherein $L_1$ and $L_2$ are half lengths of shorter and longer sides of the projected image (of a rectangular shape) provided by the projection optical system, A is the numerical aperture of the projection optical system, $\sigma$ is the coherence factor determined by an illumination condition, and $I_0$ is the energy density per pulse upon the image plane. The shape of the projected image may be square and, on that occasion, $L_1=L_2$. Characters R, $\phi_1$ and $\phi_2$ will be described later.

Figure 2:
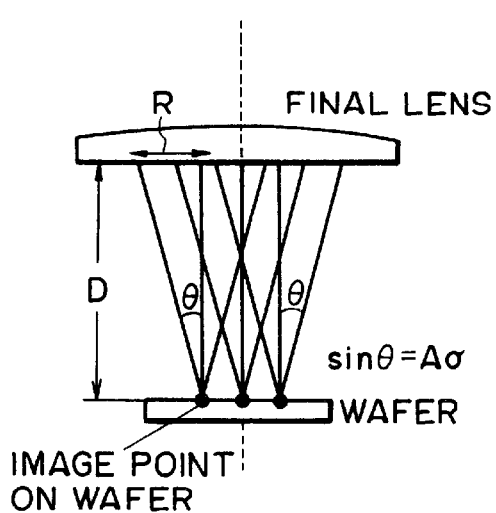
FIGS. 2, 3, 4, 5, 6 and 7 are schematic views, respectively, for explaining light intensity upon the last lens.

FIG. 2 is a schematic view for explaining the action of light rays in the vicinity of the last lens and the wafer surface. Those of the light rays imaged upon image points on the wafer surface which are contributable to the compaction, have a numerical aperture corresponding to the product of the numerical aperture A of the projection optical system and the coherence factor $\sigma$. That is, by using the angle $\theta$, it is sin $\theta = A\sigma$.

Figure 3:
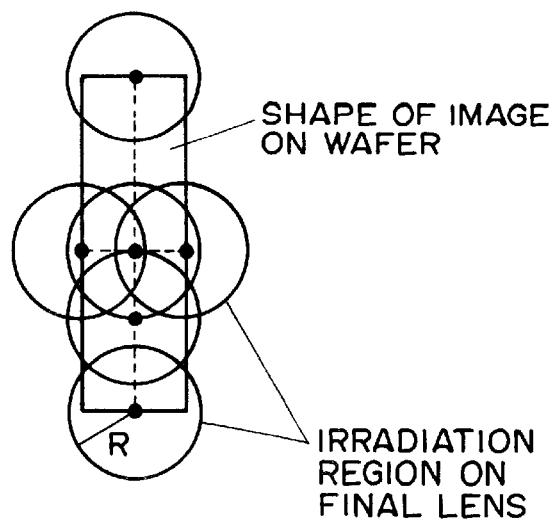

FIG. 3 illustrates this as viewed in the optical axis direction. Circles in the drawing indicate regions wherein the light rays to be imaged on the image points (dots in the drawing) on the wafer pass the last lens. The radius is R. It is seen from FIG. 2 that:

$$R = D \tan\theta = A\sigma/[\sqrt{1-(A\sigma)^2}]D$$

It is seen that the image point positions, upon the wafer, of those of light rays from the image points which are contributable to the central portion of the last lens, are in a region of four types as illustrated in FIGS. 4, 5, 6 and 7, under the magnitude relation between R and image shape ($L_1$ and $L_2$).

Figures 4, 5:
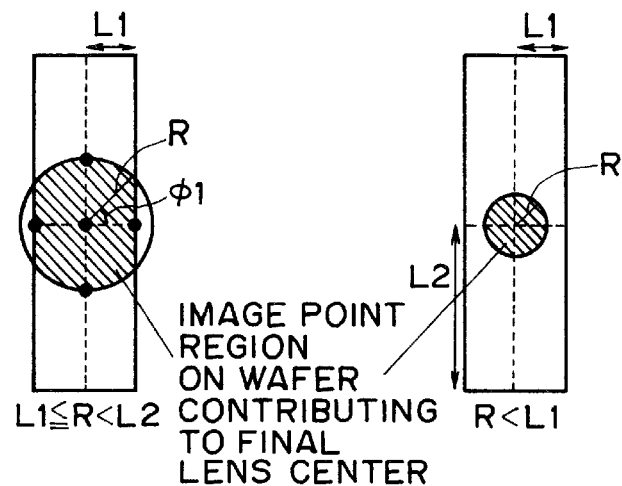
Figure 6:
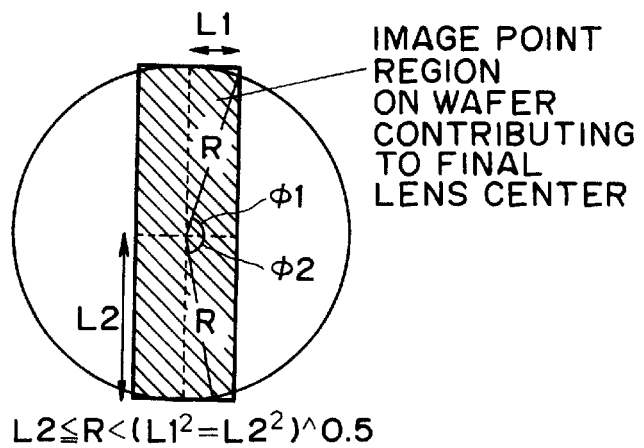
Figure 7:
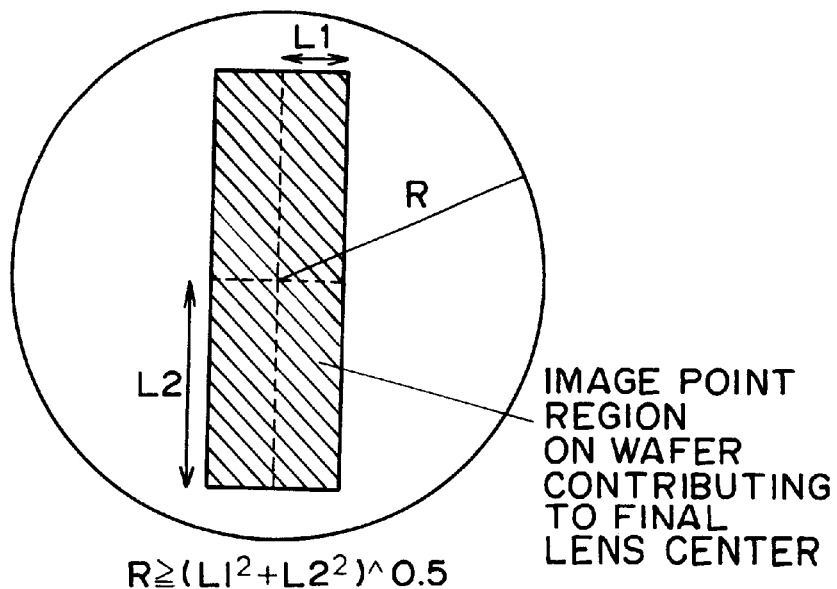

Particularly, in the types shown in FIGS. 5 and 6, the boundary of the region is defined by arch and straight lines. Characters φ1 and φ2 in equation (3) denote the angles at the connection between the arch and straight lines.

Further, since the circular irradiation region on the last lens is illuminated substantially uniformly, the area of the hatched region corresponds to the relative light intensity at the central portion of the last lens. Equation (3) was obtained by calculating that area while taking the absolute intensity into account.

The inventor of the present invention made further investigations in relation to equation (2) known in regard to the relation between the pulse width of the laser and damage of a glass material, and found that there is a relation of equation (4) between the pulse width (the time period of emission of pulse light) and the damage.

$$\Delta n' = \beta (NI^2/\tau)^\gamma \quad (4)$$

where Δn' is the amount of change in relative refractive index (unit: ppb=$10^{-9}$), β and γ are the coefficient of refractive index change and the saturation coefficient which are determined in dependence upon the glass material, N is the number of pulses irradiated (unit: $10^6$), and I is the irradiated pulse energy density per pulse (unit: mj/cm²/pulse). Equation (4) above will be explained below.

Figure 8:
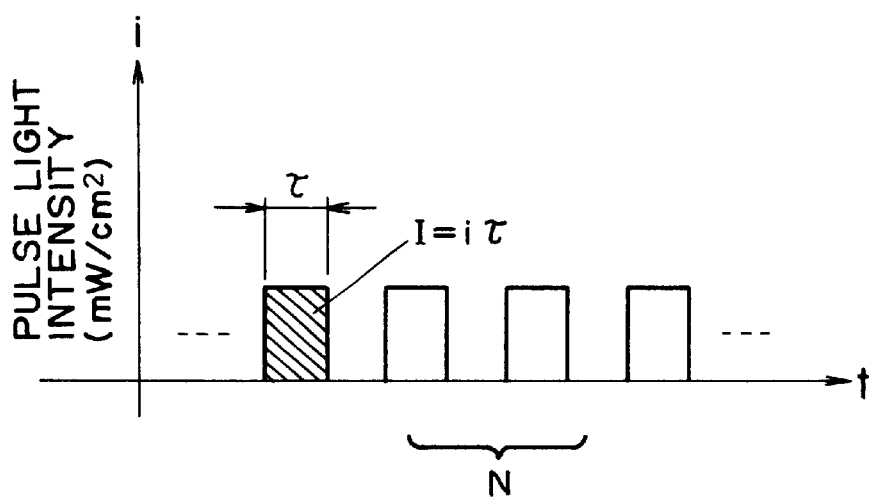
FIG. 8 is a schematic view for explaining intensity of pulse light.

FIG. 8 is a schematic view for explaining the dependency of emitted light energy of pulse emission upon time. The axis of ordinate (i) denotes the light energy density (unit: mW/cm²/pulse), and the axis of abscissa (t) denotes time (unit: sec.). Character τ denotes the pulse width (unit: sec.). Character I denotes the light energy density per single pulse, as described above, and it is obtainable by integrating the light energy intensity i with respect to the time width of one pulse. As illustrated in the drawing, approximately the intensity of a single pulse can be considered as constant and, therefore, I=iτ.

The compaction which causes a change in refractive index is produced by two-photon absorption and, therefore, the amount of change in refractive index is proportional to the transition probability of the two-photon absorption. The transition probability of two-photon absorption is proportional to the photon presence probability, that is, the square of light energy density i.

The transition probability in a certain time interval is proportional to the emission time in that time interval. Since the emission time is the product of the pulse width τ and the pulse number N, in regard to the amount of change in refractive index there is a relation Δn' i²τN. Using I=iτ, a relation $$\Delta n' \, (NI^2/\tau)$$

is obtained. The saturation effect as defined in equation (2) may be taken into account, and then the relation of equation (4) is obtained.

As described above, according to the investigations made by the inventor, it has been found that the relation between the light energy at the central portion of the last lens as well as the relation between the laser pulse width and damage of the glass material are expressed by equations (3) and (4). By using theses equations (3) and (4) in combination, a high precision exposure apparatus including a projection optical system with the restrictive condition for back focus relieved considerably, as aimed at the present invention, can be accomplished. Such an exposure apparatus may be structured so as to satisfy equation (5) below.

$$\tau > (\beta/\Delta n'_{max})^{1/\gamma} NI_0^2 f^2(D) \quad (5)$$

where $\Delta n'_{max}$ denotes a tolerable change in relative refractive index. Usually, the value of it is about 500 ppb, but it may be determined appropriately with the exposure apparatus. Regarding f(D) and any other variables, they may be ones similar to those in equation (3) or (4).

As described, the optical design may be made within the structural range of equation (5) and, by this, it is enabled that the latitude of optical design is enhanced while avoiding deterioration of optical performance resulting from a change in refractive index due to compaction. Thus, an exposure apparatus with an excimer laser wherein deterioration of the glass material is prevented and wherein high optical performance is assured, can be accomplished.

Preferred embodiments of the present invention will now be described with reference to the drawings.

FIG. 1 is a schematic view of a main portion of a projection exposure apparatus according to a first embodiment of the present invention. Denoted in the drawing at 101 is a pulse laser light source such as an excimer laser, for example. The light from the light source 101 is transformed into exposure light of a predetermined pulse width, by pulse width adjusting means 102, and it is directed to a first illumination system 103. By means of the first illumination system 103, the exposure light is projected to illuminate, with a predetermined angular distribution, an aperture 105 formed on a light blocking mask 104 for defining an exposure region of slit-like shape which serves as a basic unit for exposure.

In this embodiment, the slit-like shape as defined by the aperture 105 has a size of 5 mm×26 mm. The light passing through the aperture 105 is projected by a second illumination system 106 to illuminate the surface of a reticle or mask (first object) 107. Here, the aperture 105 is imaged upon the reticle 107 surface by the second illumination system 106, for uniform illumination of it. The reticle 107 is held on the top of a reticle stage 108 by vacuum attraction, for example.

Denoted at 109 is a projection optical system for projecting the pattern of the reticle 107 onto the surface of a wafer (second object). In this embodiment, the projection optical system 109 has a reduction projection magnification of 1:2. It may have a reduction ratio of 1:4 or, alternatively, it may have a unit magnification. Denoted at 110 is a wafer which is a substrate to be exposed. The wafer is placed on a wafer stage 111.

In the projection exposure apparatus of this embodiment, the reticle stage 108 and the wafer stage 111 are scanningly moved in synchronism with each other, at a speed ratio corresponding to the projection magnification of the projection optical system. This enables exposure of a one-shot region wider than the slit-like exposure region.

Figure 9:
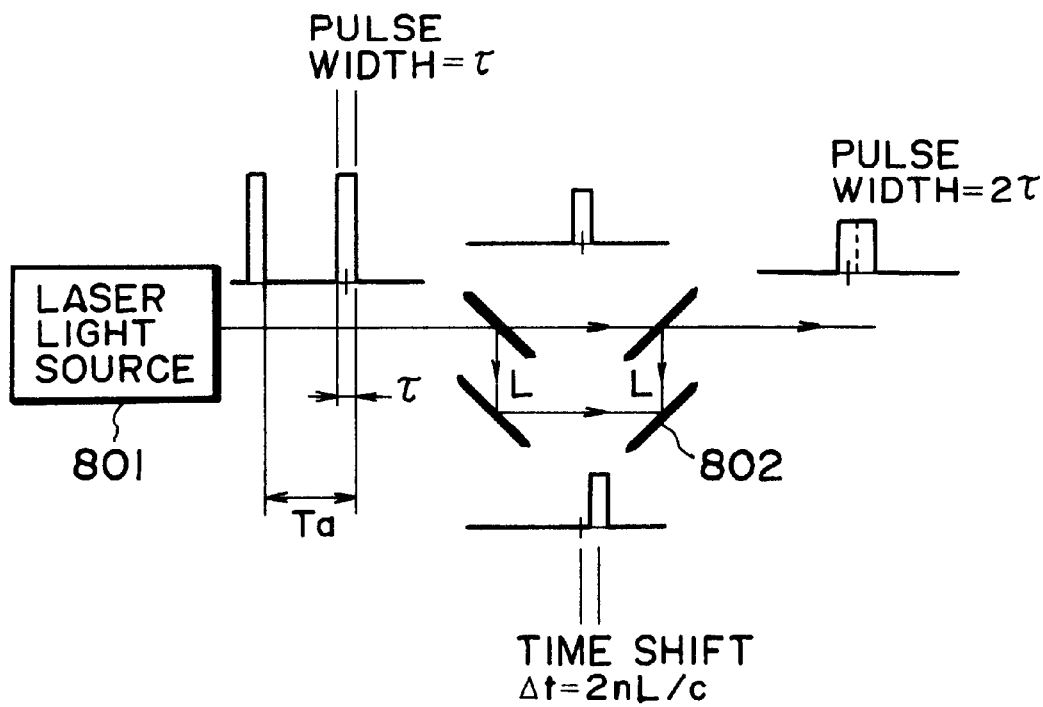
FIG. 9 is a schematic view for explaining an example of pulse width adjusting means.

FIG. 9 is a schematic view for explaining the pulse width adjusting means used in this embodiment. The laser light emitted by a laser light source 801 passes through a wave dividing and combining system 802 having a half mirror, by which it it is transformed into pulse light having its peak intensity reduced to ½ and its emission pulse width τ doubled to 2τ.

The wave dividing and combining system used in this embodiment serves to divide the light into two and to apply a relative optical path difference 2nL. Here, n is the refractive index of a medium with which the light path is filled. When the light speed is c, the amount of time shift of the pulse light between the divided two light beams is given by dT=2nL/c. Thus, by applying L with which the time shift is made approximately equal to the pulse width τ, it is assured that two pulses having intensity reduced to ½ by the half mirror are provided successively, such that a pulse of double pulse width and a half intensity is produced.

Figure 10:
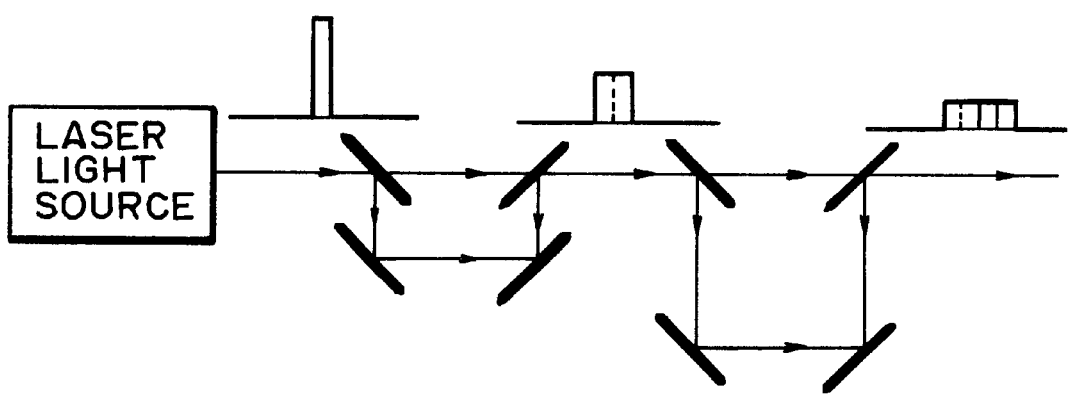
FIG. 10 is a schematic view for explaining another example of pulse width adjusting means.

Plural wave dividing and combining systems such as above may be connected in cascade as shown in FIG. 10, by which the pulse width can be adjusted more than twice.

In place of the wave dividing and combining system 802 used in this embodiment, the pulse width adjusting means 102 may appropriately use suitable means for changing the laser medium, for example.

Figure 11:
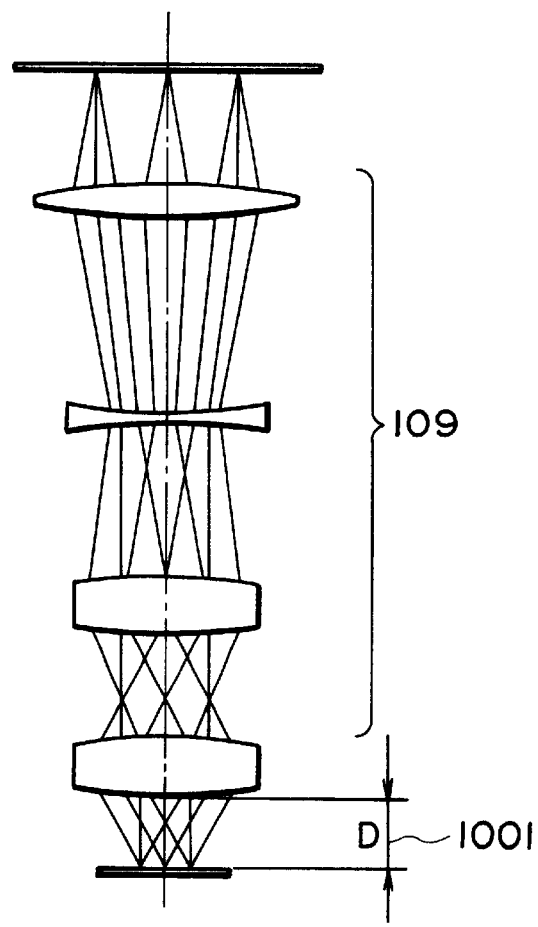
FIG. 11 is a schematic view of an example of a projection optical system.

FIG. 11 is a schematic view of the projection optical system 109 used in this embodiment. Denoted at 1001 in the drawing is the back focus D.

Numerical values in this embodiment are as follows.

Slit width $L_1$=2.5 mm

Slit width $L_2$=13 mm

Numerical aperture A=0.6

Coherence factor σ=0.7

Tolerable change in refractive index Δn'=500 ppb

Irradiation pulse number N=$10^{10}$

Glass material refractive index coefficient β=13.6

Saturation coefficient γ=0.7

Image plane energy density $I_0$=1.1 mW/cm$^2$/pulse

Figure 12:
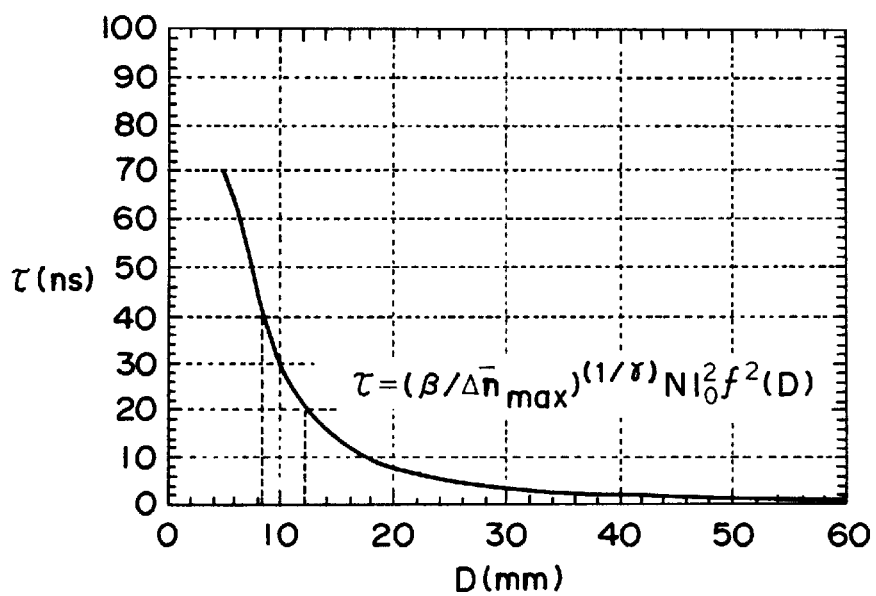
FIG. 12 is a graph for explaining the pulse width and the range of back focus, in the first embodiment of the present invention.

FIG. 12 shows the numerical range of equation (5) based on the numerical values mentioned above. In this embodiment, in accordance with this numerical range, the pulse width adjusting means 102 provides a pulse width not less than 20 ns. The design may be made with the restriction to the back focus D of the projection optical system 109 being extended to 12 mm or less. By this, the optical performance can be improved remarkably as compared with a projection optical system having long back focus.

In this embodiment, the laser driving frequency is 1 KHz which is quite usual. In the case of 20 ns pulse width, the emission time ratio, that is, (driving frequency)×(pulse width), corresponds to 2×$10^{-5}$. The light emission time ratio sx in this case, when the pulse interval is Ta and the pulse width is τ as shown in FIG. 9, is given by:

$$sx=\tau/Ta.$$

If the driving frequency is 2 KHz, substantially the same advantageous result is attainable with a pulse width 10 ns.

Next, a second embodiment of the present invention will be described. In this embodiment, in accordance with the numerical range of equation (5), the pulse width adjusting means 102 produces a pulse width 40 ns, and the restriction to back focus D of the projection optical system 109 described above is extended to 8 mm or less. By this, further improvement of optical performance as compared with the first embodiment, is enabled.

In this embodiment, the laser driving frequency is 1 KHz which is quite usual. In the case of 40 ns pulse width, the light emission time ratio, that is, (driving frequency) x (pulse width), corresponds to 4×$10^{-5}$. If the driving frequency is 2 KHz, substantially the same advantageous result as that of the present embodiment is attainable with 20 ns pulse width.

As illustrated in FIG. 12, in accordance with this embodiment, a good projection optical system with less glass material damage can be accomplished with a back focus not less than 12 mm for a pulse width of 20 ns, and with a back focus not less than 8 mm for a pulse width of 40 ns.

In this embodiment as described above, the pulse with τ is extended by the pulse width adjusting means, by which damage of a glass material can be reduced even if the back focus of the projection optical system is short.

In this embodiment, the word "approximately" which may be used in the context of "approximately 20 ns" or "approximately 2×$10^{-5}$", and on that occasion the word "approximately" means a tolerance of ±1%.

The present invention is not limited to the forms of the embodiments described above. Sequential procedure, for example, may be modified within the scope of the invention.

Next, an embodiment of a device manufacturing method which uses a projection exposure apparatus such as described above, will be explained.

Figure 13:
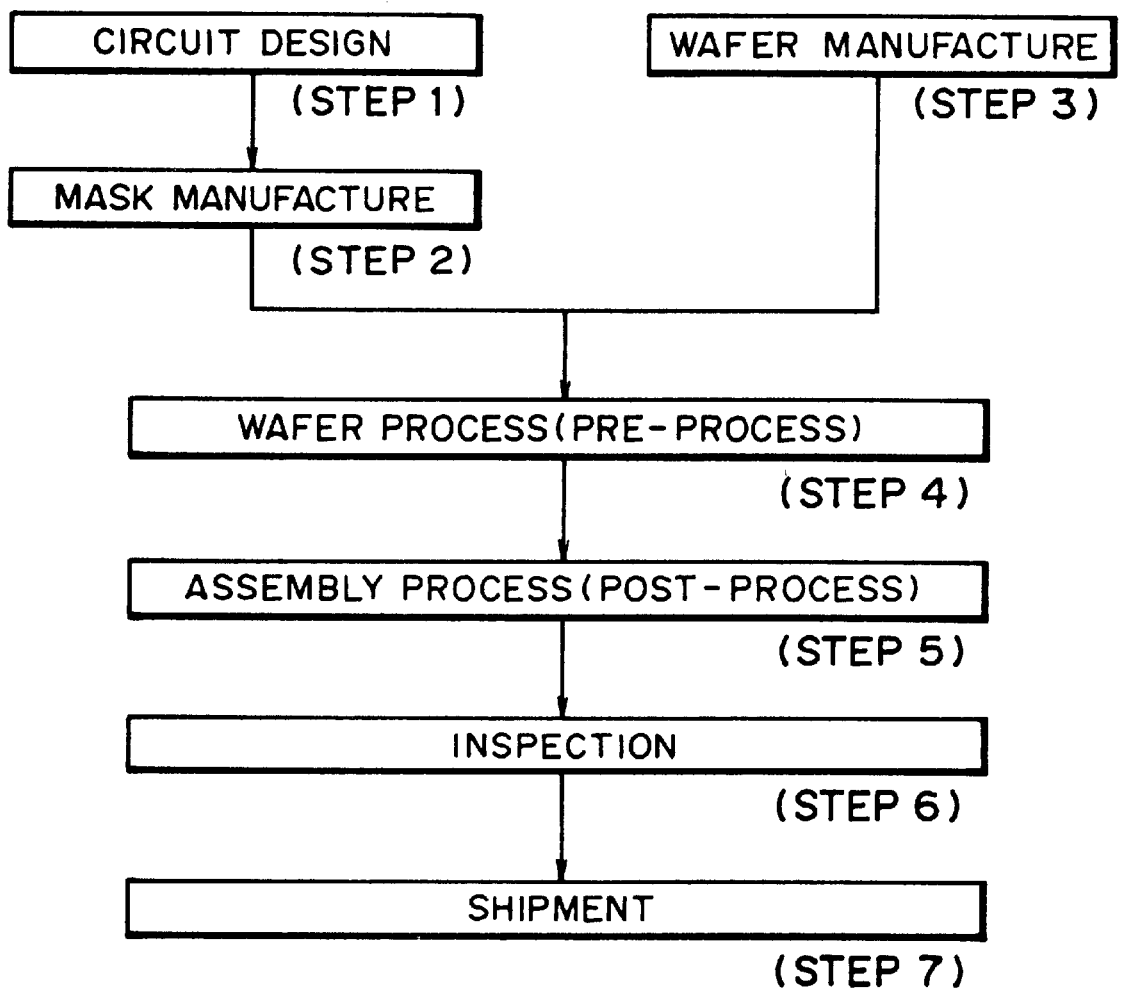
FIG. 13 is a flow chart of semiconductor device manufacturing processes, in an embodiment of the present invention.

FIG. 13 is a flow chart of a procedure for the manufacture of microdevices such as semiconductor chips (e.g., ICs or LSIs), liquid crystal panels, or CCDS, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 14:
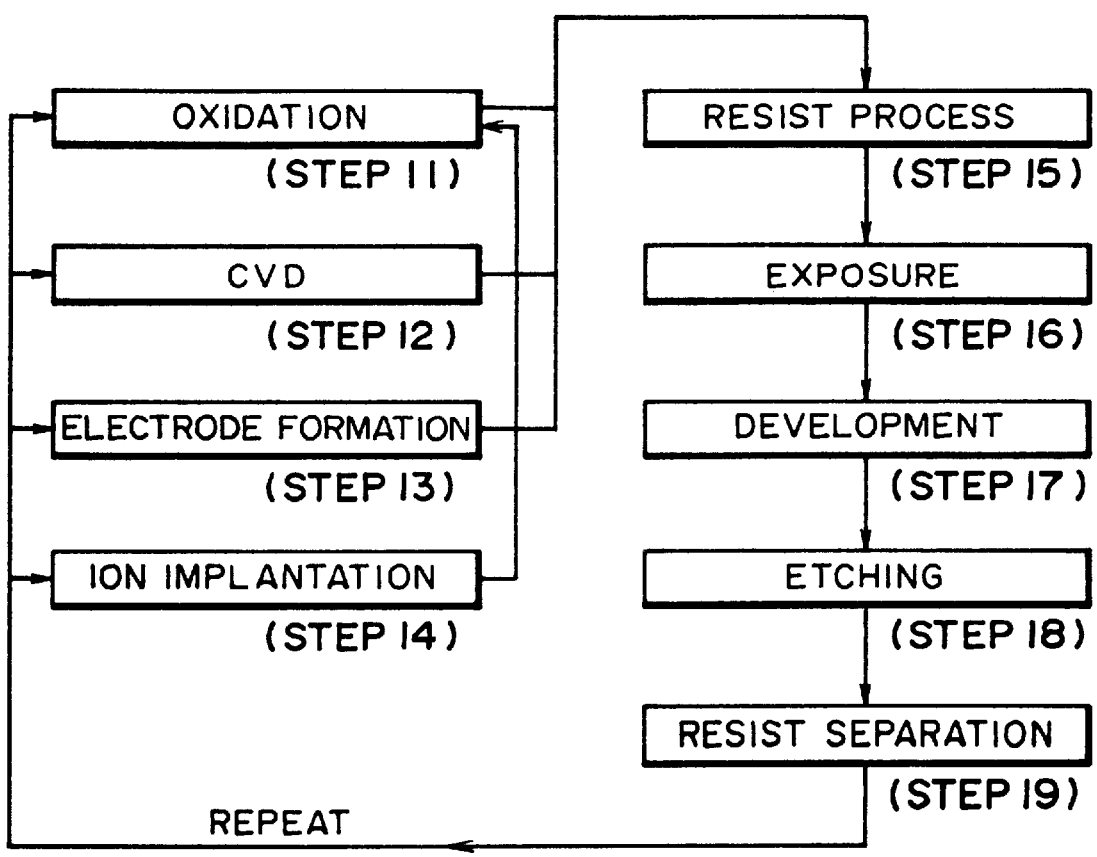
FIG. 14 is a flow chart for explaining details of a wafer process, in the procedure of FIG. 13.

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

As described above, in accordance with the embodiments of the present invention described above, there can be provided a projection exposure apparatus and/or a device manufacturing method using the same, wherein a glass material or materials constituting a projection optical system are less deteriorated and high optical performance is assured, through appropriate setting of components of the projection optical system or a pulse light source for projection exposure of a mask pattern onto a substrate to be exposed.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:

an illumination optical system for illuminating a pattern of a mask with pulse light from a light source; and a projection optical system for projecting the pattern of the mask onto a rectangular region on a substrate, wherein said exposure apparatus satisfies a relation:

$$\tau > (\beta/\Delta n'_{max})^{1/\gamma} N I_0^2 f^2(D)$$

where τ is the width of a single pulse of the pulse light, D is the distance from the last surface of the projection optical system to the surface of the substrate, β, γ, and Δn' are the coefficients of a refractive index change of, the saturation coefficient of and the tolerable change in relative refractive index of the glass material of the final lens of the projection optical system, respectively, N is the number of pulses irradiated, and $I_0$ is the energy density per pulse upon the image plane, and when $L_1$ and $L_2$ are half lengths of two sides of the rectangular region ($L_1 \leq L_2$), A is the numerical aperture of the projection optical system, and $\sigma$ is the coherence factor determined by an illumination condition, $$f(D) =$$
$$1 \qquad (R < L_1)$$
$$1 - (2/\pi)[\phi_1 - \sin(2\phi_1)/2] \qquad (L_1 \leq R < L_2)$$
$$1 - (2/\pi)\{\phi_1 + \phi_2 - [\sin(2\phi_1) + \sin(2\phi_2)]/2\} \qquad \left(L_2 \leq R < \sqrt{L_1^2 + L_2^2}\right)$$
$$4L_1 L_2 / \pi R^2 \qquad \left(\sqrt{L_1^2 + L_2^2} \leq R\right)$$

wherein $R = \left[A\sigma / \sqrt{1 - (A\sigma)^2}\right] D$, $\cos\phi_1 = L_1/R$ and $\cos\phi_2 = L_2/R$.

2. A projection exposure apparatus, comprising:

an illumination optical system for illuminating a pattern of a mask with pulse light from a light source; and a projection optical system for projecting the pattern of the mask onto a rectangular region on a substrate, wherein a pulse light emission time ratio of the pulse light is not less than $2 \times 10^{-5}$, and wherein the distance from the last surface of the projection optical system to the surface of the substrate is not greater than 12 mm.

3. An apparatus according to claim 2, wherein, when the light source has an emission frequency of 1 KHz, the pulse width of a single pulse of the pulse light is not less than 20 ns.

4. A projection exposure apparatus, comprising:

an illumination optical system for illuminating a pattern of a mask with pulse light from a light source; and a projection optical system for projecting the pattern of the mask onto a rectangular region on a substrate, wherein a pulse light emission time ratio of the pulse light is not less than $4 \times 10^{-5}$, and wherein the distance from the last surface of the projection optical system to the surface of the substrate is not greater than 8 mm.

5. An apparatus according to claim 4, wherein, when the light source has an emission frequency of 1 KHz, the pulse width of a single pulse of the pulse light is not less than 40 ns.

6. An apparatus according to any one of claims 1, 2 and 4, wherein the pulse light has a wavelength of about 193 nm.

7. An apparatus according to any one of claims 1, 2 and 4, wherein the light source comprises an excimer laser.

8. An apparatus according to any one of claims 1, 2 and 4, further comprising scanning means for relatively and scanningly moving the mask and the substrate, in a timed relation and at a speed ratio corresponding to the projection magnification of the projection optical system, for performing scanning projection exposure.

9. A device manufacturing method comprising the steps of:

projecting a pattern of a reticle onto the surface of a wafer through a projection exposure apparatus as recited in any one of claims 1–5, for performing exposure of the wafer; and developing the exposed wafer.

* * * * *

UNITED STATES PATENT AND TRADEMARK OFFICE
CERTIFICATE OF CORRECTION

PATENT NO. : 6,252,662 B1
DATED : June 26, 2001
INVENTOR(S) : Mitsuro Sugita

Page 1 of 1

It is certified that error appears in the above-identified patent and that said Letters Patent is hereby corrected as shown below:

Column 1,
Line 43, "aof" should read -- a of --; and
Line 50, "β" should read -- γ --.

Column 2,
Line 38, "coefficient" should read -- coefficients --.

Column 5
Line 49, "Δn'" should read -- Δn'∝ --;
Line 52, "Δn'" should read -- Δn'∝ --; and
Line 60, "theses" should read -- these --.

Column 6,
Line 51, "it" (first occurrence) should be deleted.

Column 8,
Line 3, "CCDS," should read -- CCDs, --.

Signed and Sealed this

Twenty-third Day of April, 2002

Attest:

Attesting Officer

JAMES E. ROGAN
Director of the United States Patent and Trademark Office